United States Patent [19]

Wagner

[11] Patent Number: 5,070,253
[45] Date of Patent: Dec. 3, 1991

[54] SOLID STATE CONTROL CIRCUIT FOR A DUAL BATTERY POWER SUPPLY

[75] Inventor: Edward T. Wagner, Annapolis, Md.
[73] Assignee: Westinghouse Electric Corp., Pittsburgh, Pa.
[21] Appl. No.: 515,948
[22] Filed: Apr. 27, 1990
[51] Int. Cl.$^5$ .................. H02J 1/06; H03K 17/56
[52] U.S. Cl. ............................ 307/75; 307/247.1; 307/85; 363/63
[58] Field of Search ............ 307/75, 72, 43, 85, 307/86, 87, 64, 66, 262, 571, 585, 247.1; 363/63; 323/268, 270, 271

[56] References Cited

U.S. PATENT DOCUMENTS

| | | | |
|---|---|---|---|
| 4,044,268 | 8/1977 | Hammel | 307/66 |
| 4,093,878 | 6/1978 | Paschal et al. | 307/247.1 |
| 4,207,475 | 6/1980 | Nercessian | 323/268 |
| 4,297,629 | 10/1981 | Godard | 307/7 |
| 4,398,098 | 8/1983 | Minchey | 307/140 |
| 4,484,084 | 11/1984 | Cheffer | 307/64 |
| 4,492,876 | 1/1985 | Colbert et al. | 307/44 |
| 4,618,813 | 10/1986 | Vesce et al. | 323/268 |
| 4,730,121 | 3/1988 | Lee et al. | 307/66 |
| 4,754,160 | 6/1988 | Ely | 307/64 |
| 4,812,672 | 3/1989 | Cowan et al. | 307/64 |

FOREIGN PATENT DOCUMENTS 0490236  1/1976  U.S.S.R. ............... 323/268

Primary Examiner—A. D. Pellinen
Assistant Examiner—Richard T. Elms
Attorney, Agent, or Firm—D. Schron

[57] ABSTRACT

A solid state latching control circuit for a DC power supply including a pair of series connected DC power sources, such as batteries, which provide both a positive and negative polarity switched supply voltage to a load. A pair of complementary MOSFET transistors are simultaneously rendered conductive and non-conductive by means of the outputs of a latching type of flip-flop circuit comprised of a pair of cross-coupled CMOS NAND gates whose mutually opposite on and off states are switched in response to the operation of a pair of electrical switches, a third CMOS NAND gate and a differentiator circuit coupled to one of the flip-flop inputs, and an R-C charging and discharging network coupled to another of the flip-flop inputs.

23 Claims, 3 Drawing Sheets

SOLID STATE CONTROL CIRCUIT FOR A DUAL BATTERY POWER SUPPLY

BACKGROUND OF THE INVENTION

This invention relates generally to power supply switching circuits, and more particularly to a solid state, low power latching type switching circuit which connects and disconnects battery power to and from a load.

Power supply switching circuits are generally known and take many forms. For example, such apparatus has usually found application where power supplied to a circuit from a primary source is switched to a secondary source in response to a predetermined condition, typically the failure of the primary power source. Heretofore, a mechanical magnetically latching relay has been known to be utilized for interconnecting the power sources to the load but such a device inherently suffers from being sensitive to vibration and electromagnetic noise. In such instances, the relay contacts can be forced into an undesirable neutral state which virtually renders the switching control useless. More recently, however, power supply switching arrangements have been developed where solid state circuitry is used as an electronic relay to control and connect one or more power supplies to a load in order to, among other things, overcome the vibration and noise problem.

It is an object of the present invention, therefore, to provide an improvement in circuitry for connecting a power supply to a load.

It is another object of the invention to provide an improved solid state latching type of control circuit for connecting a dual battery power supply to a load while consuming a minimal amount of power.

And yet a further object of the invention is to provide a solid state latching control circuit which replaces a mechanical magnetically latching relay for controlling power supply voltages of both positive and negative polarities from a pair of DC batteries utilized concurrently.

And it is yet another object of the invention to provide a low power latching control circuit for dual battery power supply which exhibits relatively high electrical noise immunity while being insensitive to mechanical vibrations.

SUMMARY

Briefly, the foregoing and other objects are achieved by a solid state latching control circuit for a DC power supply including a pair of series connected DC power sources, such as batteries, which provide both a positive and negative polarity switched supply voltage to a load by means of a pair of complementary MOSFET gate devices which are simultaneously rendered conductive and non-conductive by means of the outputs of a latching type of flip-flop circuit comprised of a pair of cross coupled NAND gates whose mutually opposite on and off states are switched in response to the operation of a pair of electrical switches, a third NAND gate and a differentiator circuit coupled to one of the flip-flop inputs, and an R-C charging and discharging network coupled to another of the flip-flop inputs.

BRIEF DESCRIPTION OF HE DRAWINGS

The details of the subject invention will be more readily understood when considered together with the accompanying drawings wherein.

DETAILED DESCRIPTION OF THE INVENTION

Figure 1:
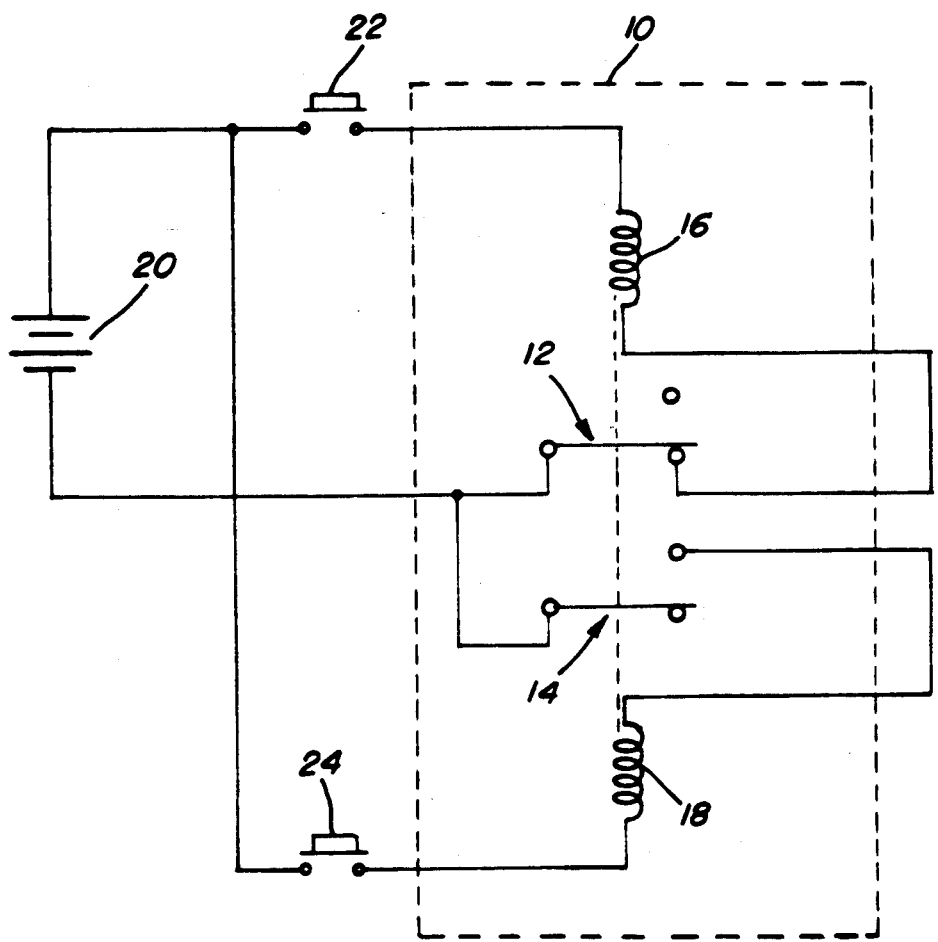
FIG. 1 is an electrical schematic diagram illustrative of a known latching type of relay circuit connection.

Referring now to the drawings and more particularly to FIG. 1, shown there at is what is referred to as a "cut-throat" connection for a latching relay where a closed set of contacts is coupled in series with the coil that opens those contacts. More particularly, an electrical relay 10 is shown comprising two sets of relay contacts 12 and 14 and a pair of relay coils 16 and 18 on either side of the two sets of relay contacts for alternately providing switched apparatus states.

A DC battery 20 is shown connectable to the relay coil 16 and a pair of closed contacts of the set of relay contacts 12 by means of a first switch 22 and to the second relay coil through the open pair of switch contacts of the set of relay contacts 14 by means of a second switch 24. With the relay 10 in the state shown, when switch 22 is depressed, current will flow through coil 16 which operates the relay to open the closed pair of contacts and thereby interrupting the current in coil 16. The relay 10 is said to latch in that position with the lower set of relay contacts switching position.

When switch 24 is next depressed, current flows through relay coil 18 which again opens the switch contacts of relay contacts 14 to an open position which now interrupts the current in the coil 18. And again, the relay magnetically latches in this position. In each case, the relay 10 latches in each of two switched positions with interruption of the current being effected in the coil which causes the relay contacts to switch. A relay when used in this configuration prevents the flow of current in the relay coils 16 and 18 during steady state conditions, thus power is only consumed during the transition from one switched state to the other.

Figure 2:
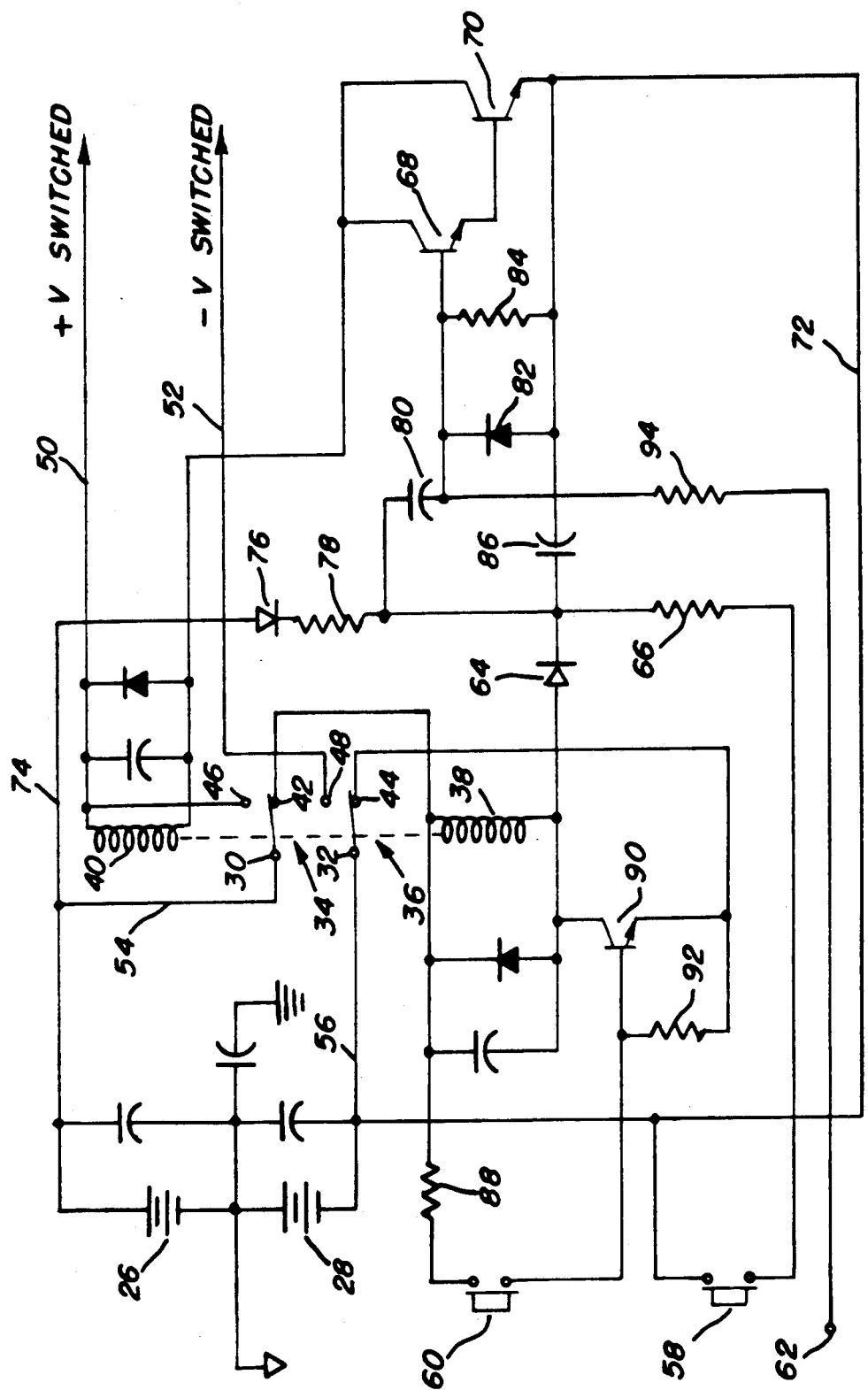
FIG. 2 is an electrical schematic diagram illustrative of a dual battery type power supply utilizing an electrically operated mechanical latching relay for providing both positive and negative polarity supply voltages to a load in accordance with the known prior art.

A more complicated configuration for this type of relay operation is shown in FIG. 2 where a pair of series connected batteries 26 and 28 have mutually opposite polarity terminals (+) and (−) connected to the wiper contacts 30 and 32 of two sets of relay contacts 34 and 36 which are activated first in one direction by means of relay coil 38 and then deactivated to the original position by means of a second relay coil 40.

Reference numeral 42 denotes the deactivated closed contact of the set of relay contacts 34 while reference numeral 44 denotes the corresponding deactivated closed relay contact of the set of relay contacts 36. Reference numerals 46 and 48, on the other hand, denote the deactivated open contacts of the set of contacts 34 and 36. Switched positive and negative voltages +V and −V are adapted to be respectively supplied from the batteries 26 and 28 to the voltage supply lines 50 and 52 through relay contacts 30, 46 and 32, 48, respectively, when the relay coil 38 is activated, since circuit leads 54 and 56 connect to the positive terminal (+) of battery 26 and the negative terminal (−) of battery 28.

A first and a second "cut-throat" circuit configuration is provided in the circuit of FIG. 2 by means of circuit lead 54 being connected to one side of the activate relay coil 38 through relay contacts 30 and 42 and from circuit lead 54 to one side of the deactivate relay coil 40 through relay contacts 30 and 46.

Further as shown, the circuit of FIG. 2 can be turned "on", i.e. activated, in either of two ways, by means of switch 58 or switch 60. Switch 58 operates like a standard on/off toggle switch, meaning if switch 60 is closed, the circuit will be activated, while if switch 60 is open, the circuit will be deactivated. Switch 60, on the other hand, operates like a momentarily operated switch such as a pushbutton switch. When switch 60 is momentarily closed and then opened, the circuit is activated and will stay activated until a positive voltage (+V) is applied to terminal 62.

Considering first the operation of FIG. 2 in accordance with switch 58 and assuming that the relay is in the "off" or deactivated state, relay contacts 30, 42 and 32, 44 make contact as shown, the activate coil 38 is connected to the (+) side of the battery 26 through relay contacts 30 and 42 while the other side is connectable to the negative side of the battery 28 through the diode 64, resistor 66 and the open switch 58.

Upon closure of switch 58, relay coil 38 becomes energized, now causing relay contacts 30 and 46 to make contact as well as contacts 32 and 48. The positive (+) side of the battery 26 and circuit lead 54 is now connected to one side of the deactivate coil 40 whose other side is connected to the collector electrodes of a pair of n-p-n transistors 68 and 70 which are connected in a well known Darlington configuration. The emitter of transistor 70 is connected back to the negative (−) side of the battery 28 via circuit lead 72. The positive terminal (+) of the battery 26 is also connected via circuit lead 74 to the base of transistor 68 by means of the diode 76, the resistor 78 and the capacitor 80. A diode 82 and a resistor 84 is also shown connected in parallel from the base of transistor 68 to circuit lead 72 and to a capacitor 86 which couples back to the switch 58 through the resistor 66. If the circuit as shown in FIG. 2 has been in an activated state for any length of time, capacitors 80 and 86 become discharged.

Upon opening of switch 58, the voltage divider action provided between resistors 78 and 84 results in a bias voltage being applied across the base-emitter junction of the Darlington transistor pair 68 and 70. These transistors become conductive, causing a pulse of current to flow through the deactivate coil 40 which returns the circuit to the "off" or deactivated state. With respect to the operation of the circuit with switch 60, in its deactivated state it is coupled to one side of the activate coil 38 by resistor 88. The other side of the relay coil 38 is coupled back to the switch 60 through the transistor 90 and resistor 92.

Momentary closure of switch 60 causes transistor 90 to turn "on", i.e. become conductive, causing a pulse of current through the activate coil 38 which latches the circuit in its present activated state until a positive voltage (+V) is applied to terminal 62. Terminal 62 is shown connected to the base of transistor 68 by means of resistor 94, causing the Darlington pair of transistors 68 and 70 to become conductive, which again causes a pulse of current to pass through the deactivate coil 40, again putting the circuit back into the deactivated state.

Both of the circuits shown in FIGS. 1 and 2 inherently suffer from being able to be forced into a "neutral" state where, for example, the contacts of sets 12 and 14 in FIG. 1 are caught in their upper and lower states, respectively, rendering the switches 22 and 24 useless so that they are incapable of operating the relay. This can occur, for example, as a result of high levels of vibration which causes relay bounce, relatively high local magnetic fields, and failure to use the relay in accordance with the manufacturer's specifications.

Figure 3:
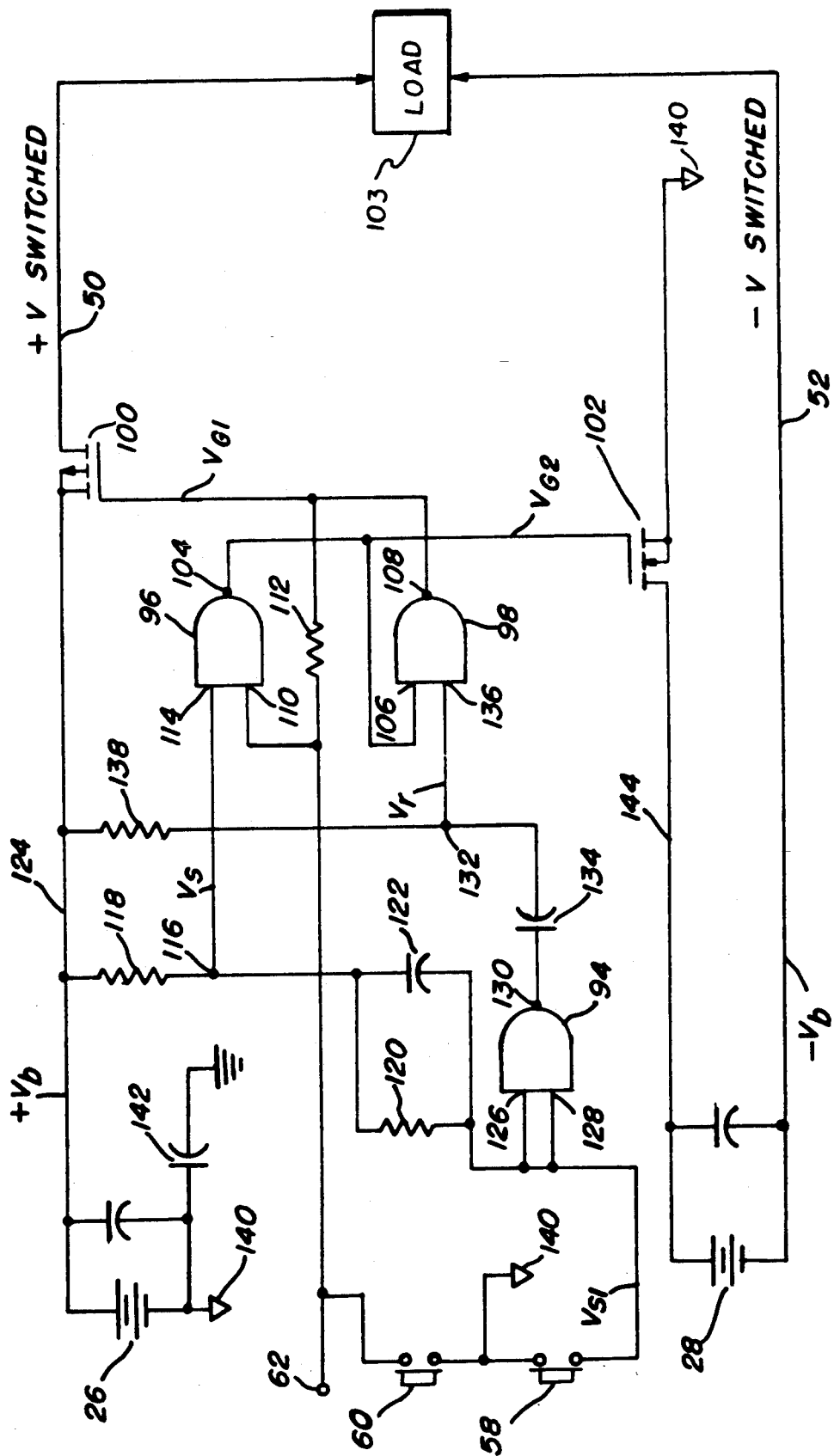
FIG. 3 is an electrical schematic diagram illustrative of the preferred embodiment of the invention.

Considering now the preferred embodiment of the invention which provides a remedy for the above noted limitations, reference is now made to FIG. 3 which is comprised of three CMOS NAND gates 94, 96 and 98, two of which are cross-coupled to form a set-reset type of flip-flop circuit for controlling the conductivity of two complementary MOSFET transistors 100 and 102 and which are respectively coupled between a pair of DC batteries 26 and 28 and voltage supply lines 50 and 52. The two NAND gates are cross-coupled by a direct connection from the inverting output 104 of NAND gate 96 to the non-inverting input 106 of NAND gate 98 and by a connection from the output 108 of NAND gate 98 to a non-inverting input 110 of NAND gate 96 by resistor 112.

The other non-inverting input 114 of NAND gate 96 is connected to circuit node 116, which is common to a resistor 118 and the parallel combination of resistor 120 and capacitor 122. The other side of the resistor 118 is connected to the positive (+) terminal of the battery 26 via circuit lead which is also connected to the MOSFET transistor 100. The opposite side of the resistor 120 and capacitor 122 is commonly connected to the non-inverting inputs 126 and 128 of the NAND gate 94 and to one side of the switch 58.

The inverting output 130 is coupled to the circuit node 132 via capacitor 134. Circuit node 132 is common to the non-inverting input 136 of NAND gate 98 and one side of resistor 138 which is also coupled to the positive (+) terminal of battery 26.

The two switches 58 and 60 and +V voltage terminal 62 shown in FIG. 3 comprise the same elements shown in FIG. 2, but the switches are now connected to a circuit common connection 140 which in turn is coupled to ground by means of capacitor 142.

Considering now the operation of the circuit shown in FIG. 3, the following voltage definitions are helpful in understanding its operation. $V_{G1}$ and $V_{G2}$ comprise the gate voltages of the MOSFET transistors 100 and 102, respectively. $V_s$ is the set input to input 114 of the NAND gate 96 forming part of the set-reset flip-flop including NAND gates 96 and 98 and $V_R$ is the reset input to the input 136 of NAND gate 98. Additionally, a third voltage which requires definition is the voltage at the common inputs 126 and 128 of the NAND gate 94. This is defined as $V_{s1}.+V_b$ and $-V_b$ comprise the positive and negative battery voltages from the batteries 26 and 28 which appear on the output supply lines 50 and 52 and comprise the +V switched and −V switched supply voltages when the MOSFET transistors 100 and 102 are rendered conductive and are in their respective "on" states.

Again assuming that the circuit of FIG. 3 is in its "off" or RESET state, $V_{G1}=+V_b$ and $V_{G2}=OV$, which means that the drain to source voltage of MOSFET transistors 100 and 102 are high impedances and the load currents appearing on the voltage supply lines 50 and 52 are both zero. In this condition, the flip-flop circuit comprised of NAND gates 96 and 98 is said to be in the RESET state. When the toggle type switch 58 is closed, $V_{G1}$ is forced to OV momentarily; however, capacitor 122 immediately charges up to $+V_b$ on circuit lead 124 through resistor 118, causing $V_S$ at circuit node 116 to return from a 0V level to $+V_b$. This produces a negative pulse on the input 114 of NAND gate 96, which triggers the flip-flop circuit into its SET state. This forces $V_{G1}$ to be at 0V and $V_{G2}$ be at $+V_b$. This causes the drain-to-source impedances of the MOSFET transistors 100 and 102 to approach zero and thereby apply the battery voltages $+V_b$ and $-V_b$ to the load 103 coupled to output supply lines 50 and 52.

When switch 58 is subsequently toggled into its open position, capacitor 122, which is charged to $V_b$, now discharges through resistor 120. This causes the voltage Vs1 to make a transition from 0V to $+V_b$, which in turn causes the output voltage of the NAND gate 94 at the output 130 to change from $V_b$ to 0V. Capacitor 134 and resistor 138 form a differentiator circuit which causes a negative plse to appear at circuit node 132. This resets the NAND gate flip-flop, turning the MOSFETS 100 and 102 off. The flow of current to the load 103 through the voltage supply lines 50 and 52 now stops. Resistor 118 is chosen to be in the order of 1 kilohm so that a resistance as low as 10 kilohms across the contacts of switch 58 will not cause the voltage $V_s$ at circuit node 116 to change the logic output state of NAND gate 96.

With respect to the momentary actuated or push button switch 60, closing of this switch directly sets the NAND gate flip-flop by forcing input 110 of the NAND gate 96 to 0V. This causes the output 104 of NAND gate 96 to be $_{G2} = +V_b$ and the output 108 to be $V_{G1} = 0V$, thus turning MOSFETs 100 and 102 "on". These operating states will latch in this position until a $+V_b$ voltage is applied to terminal 62.

Upon the application of a voltage $+V_b$ at terminal 62, the NAND gate flip-flop will be reset by forcing the input 110 of NAND gate 96 to $+V_b$, causing the NAND gate 96 to change its output from $+V_b$ to 0V and the output 108 of NAND gate 98 to change from 0V to $+V_b$, turning the respective MOSFET transistors 100 and 102 off. Resistor 112 is used to prevent loading of the output 108 of NAND gate 98 upon the application of $+V_b$ or 0V to input 110 of NAND gate 96. Again the value of resistor 112 is chosen to be in the order of 1 kilohm so that a resistance as low as 10 kilohms across the switch 60 does not cause a voltage at the input 110 which will change the logic output state of NAND gate 96.

Thus what has been shown and described is a solid state switching circuit for a dual battery supply which exhibits high noise immunity, is not subject to the problems of mechanical vibrations, and utilizes a minimum number of components while consuming extremely low steady state power.

Having thus shown and described what is at present considered to be the preferred embodiment of the invention, it should be noted that the same has been made by way of illustration and not limitation. Accordingly, all modifications, alterations and changes coming within the spirit and scope of the invention as defined in the following claims are herein meant to be included.

I claim:

1. Apparatus for controlling the connection of a pair of power supply voltages of mutually opposite clarity to a load, comprising:
    a first and a second complementary type semiconductor switch device respectively coupled between said par of power supply voltages and said load;
    a bistable circuit having two stable operating states, first and second inputs and first and second outputs;
    first circuit means respectively coupling said first and second outputs to said fist and second semiconductor switch devices for rendering said switch devices conductive during one o aid two stable operating states; and
    second circuit means including first switch means coupled to said first input and second switch means coupled to aid second input for selectively switching said bistable circuit between said two stable operating states.

2. The apparatus as defined by claim 1 wherein said first and second semiconductor switch device are comprised of MOSFET transistors and said bistable circuit si comprised of a pair of cross-coupled NAND gates.

3. The apparatus as defined by claim 1 wherein said first switch means comprises a dual steady state operated witch and said second switch means comprises a momentary operated switch.

4. The apparatus as defined by claim 3 wherein said dual steady state operated switch comprise a toggle type switch and said momentary operated switch comprises a push button type switch.

5. The apparatus as defined by claim 3 wherein said bistable circuit comprises a flip-flop circuit including a pair of cross coupled NAND gates.

6. Apparatus for controlling the connection of a pair of power supply voltages of mutually opposite polarity to a load, comprising:
    a first and a second complementary type semiconductor switch device respectively coupled between said pair of power supply voltages and said load;
    a bistable circuit having two stable operating states, first and second pairs of inputs and first and second outputs;
    first circuit means respectively coupling said first and second outputs to said first and second semiconductor switch devices for rendering said switch devices conductive during one of said two stable operating states;
    a first and a second electrical switch for respectively causing said bistable circuit to switch to said one stable operating state when actuated;
    second circuit means coupled from said first electrical switch to one input of said first pair of inputs and one input of said second pair of inputs for switching said bistable circuit to said one stable operating state when actuated in a first position and switching said bistable circuit to the other of said two stable operating states when actuated to a second position;
    a voltage terminal for the application of a predetermined switching voltage thereto; and
    third circuit means coupled from said second electrical switch to the other input of said first pair of inputs for switching said bistable circuit to said one stable operating state and additionally from said voltage terminal to said other input for switching said bistable circuit to the other stable operating state upon the application of said predetermined switching voltage thereto.

7. The apparatus as defined by claim 6 wherein said first and second semiconductor switch devices comprise a pair of complementary type transistors.

8. The apparatus as defined by claim 7 and wherein said bistable circuit comprises a semiconductor flip-flop circuit having set and reset switched operating states.

9. The apparatus as defined by claim 4 wherein said first electrical switch includes a first contact coupled to a source of common voltage and a second contact coupled to said second circuit means, and wherein said second circuit means comprises a resistance-capacitance charging and discharging network coupled to one of said pair of power supply voltages and having a first circuit node connected to said one input of said first pair of inputs, and an inverting binary logic gate coupled to a voltage differentiator circuit coupled to said one power supply voltage and having a second circuit node connected to said one input of said second pair of inputs of said flipflop circuit.

10. The apparatus as defined by claim 9 and wherein said second electrical switch includes a first contact coupled to said source of common voltage and a second contact coupled to third circuit means, and wherein said third circuit means comprises a direct connection between said second contact of said second electrical switch, said voltage terminal and said other input of said first pair of inputs of said flip-flop circuit.

11. The apparatus as defined by claim 10, wherein said flip-flop circuit comprises a pair of cross-coupled binary logic gates.

12. The apparatus as defined by claim 11 wherein said pair of cross-coupled logic gates comprises first and second NAND gates.

13. The apparatus as defined by claim 12 wherein said NAND gates comprise CMOS NAND gates.

14. The apparatus as defined by claim 13 and wherein said pair of complementary type transistors comprise a pair of field effect transistors.

15. The apparatus as defined by claim 14 wherein said field effect transistors comprise MOSFET transistors.

16. The apparatus as defined by claim 12 and wherein said inverting binary logic gate of said second circuit means comprises a third NAND gate having a pair of inputs and an output.

17. The apparatus as defined by claim 16 wherein said third NAND gate comprises a CMOS NAND gate.

18. The apparatus as defined by claim 16 wherein said pair of inputs of said third NAND gate are commonly coupled to said second contact of said second electrical switch and said voltage differentiator is coupled to said output of said third NAND gate.

19. The apparatus as defined by claim 18 and wherein said voltage differentiator comprises a first resistor and a first capacitor connected in series and wherein said second circuit node connected to said one input of said second pair of inputs comprises a junction between said resistor and capacitor.

20. The apparatus as defined by claim 18 wherein said charging and discharging network of said second circuit means includes a second resistor and a second capacitor coupled in parallel between said second contact of said first electrical switch and said first circuit node and a third resistor coupled from said first circuit node to said one power supply voltage.

21. The apparatus as defined by claim 20 and additionally including a fourth resistor coupled between the other input of said first pair of inputs and the second output of said flip-flop circuit, and a direct connection between said first output and the other input of said second pair of inputs of said flip-flop circuit.

22. The apparatus as defined by claim 21 wherein said first, second and third NAND gate comprises CMOS NAND gates.

23. The apparatus as defined by claim 22 wherein said pair of complementary transistors comprise MOSFET transistors, each having a gate control electrode and wherein said first and second outputs of said flip-flop circuit are respectively coupled to the gate control electrodes of said MOSFET transistors.

* * * * *